United States Patent
Colpo et al.

(10) Patent No.: US 8,021,515 B2
(45) Date of Patent: Sep. 20, 2011

(54) INDUCTIVELY COUPLED PLASMA PROCESSING APPARATUS

(75) Inventors: Pascal Colpo, Annecy (FR); François Rossi, Cittiglio (IT); Reinhard Fendler, Moritzburg/OT Boxdorf (DE)

(73) Assignee: The European Community, Represented by the European Commission (BE)

( * ) Notice: Subject to any disclaimer, the term of this patent is extended or adjusted under 35 U.S.C. 154(b) by 979 days.

(21) Appl. No.: 11/720,113

(22) PCT Filed: Nov. 22, 2005

(86) PCT No.: PCT/EP2005/056157
§ 371 (c)(1),
(2), (4) Date: Nov. 14, 2007

(87) PCT Pub. No.: WO2006/056573
PCT Pub. Date: Jun. 1, 2006

(65) Prior Publication Data
US 2009/0223928 A1    Sep. 10, 2009

(30) Foreign Application Priority Data
Nov. 25, 2004 (EP) .................................. 04106093

(51) Int. Cl.
C23C 16/00 (2006.01)
H01L 21/306 (2006.01)
(52) U.S. Cl. ........... 156/345.48; 118/723 I; 118/723 IR; 118/723 AN; 156/345.49
(58) Field of Classification Search ................ 118/723 I, 118/723 IR, 723 AN; 156/345.48, 345.49; 315/111.51
See application file for complete search history.

(56) References Cited

U.S. PATENT DOCUMENTS

| 5,435,881 | A | 7/1995 | Ogle |
| 6,080,271 | A * | 6/2000 | Fujii ......................... 156/345.48 |
| 6,204,607 | B1 | 3/2001 | Ellingboe |
| 6,273,022 | B1 | 8/2001 | Pu et al. |
| 6,321,681 | B1 * | 11/2001 | Colpo et al. ................ 118/723 I |
| 6,361,644 | B1 | 3/2002 | Collins |
| 6,682,630 | B1 * | 1/2004 | Colpo et al. ............. 156/345.48 |
| 2004/0060517 | A1 | 4/2004 | Vukovic et al. |

FOREIGN PATENT DOCUMENTS

| EP | 0 908 923 | 4/1999 |
| EP | 1 089 319 | 4/2001 |
| EP | 1 253 216 | 10/2002 |

OTHER PUBLICATIONS

International Search Report; PCT/EP2005/056157; Feb. 1, 2006.

(Continued)

Primary Examiner — Luz L. Alejandro
(74) Attorney, Agent, or Firm — Cantor Colburn LLP

(57) ABSTRACT

An inductively coupled plasma processing apparatus (100) comprises a plasma chamber (12) with a dielectric window (400) forming a self-supporting wall element of the plasma chamber (12). The dielectric window (400) has an external and an internal side with respect to the chamber (12). An electromagnetic field source (140) is arranged in front of the external side of the dielectric window (400) for generating an electromagnetic field within the plasma chamber (12). The field source comprises at least one magnetic core (301, 302, 303). The at least one magnetic core (301, 302, 303) is attached to the external side of the dielectric window (400), such that the at least one magnetic core helps the dielectric window (400) to withstand collapsing forces caused by negative pressure inside said chamber during operation.

19 Claims, 3 Drawing Sheets

OTHER PUBLICATIONS

Meziani T et al: "Design of a magnetic-pole enhanced inductively coupled plasma source" Plasma Sources, Science and Technology IOP Publishing UK, vol. 10, No. 2, May 2001, pp. 276-283, XP002331669; ISSN: 0963-0252 p. 278, left-hand column, paragraph 1; right-hand column, last paragraph; figures 3, 4, 14.

* cited by examiner

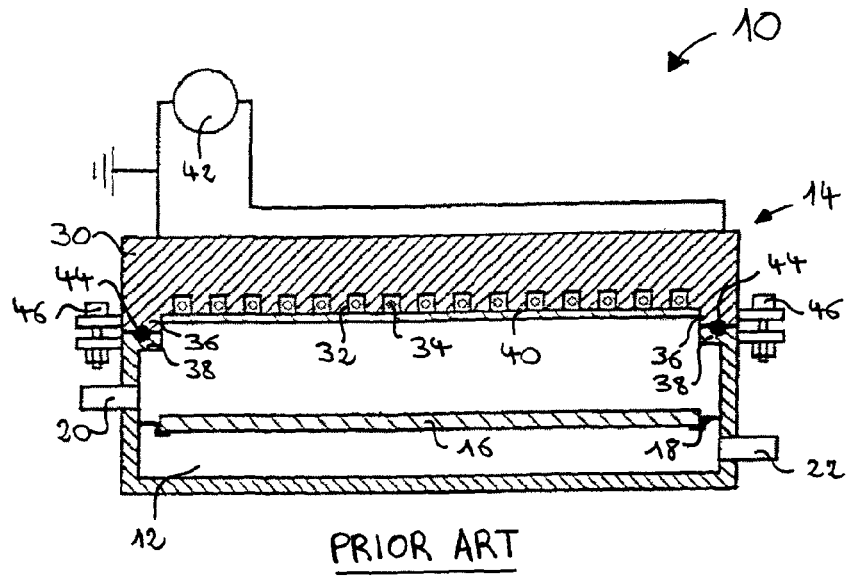
PRIOR ART
- Fig. 1 -
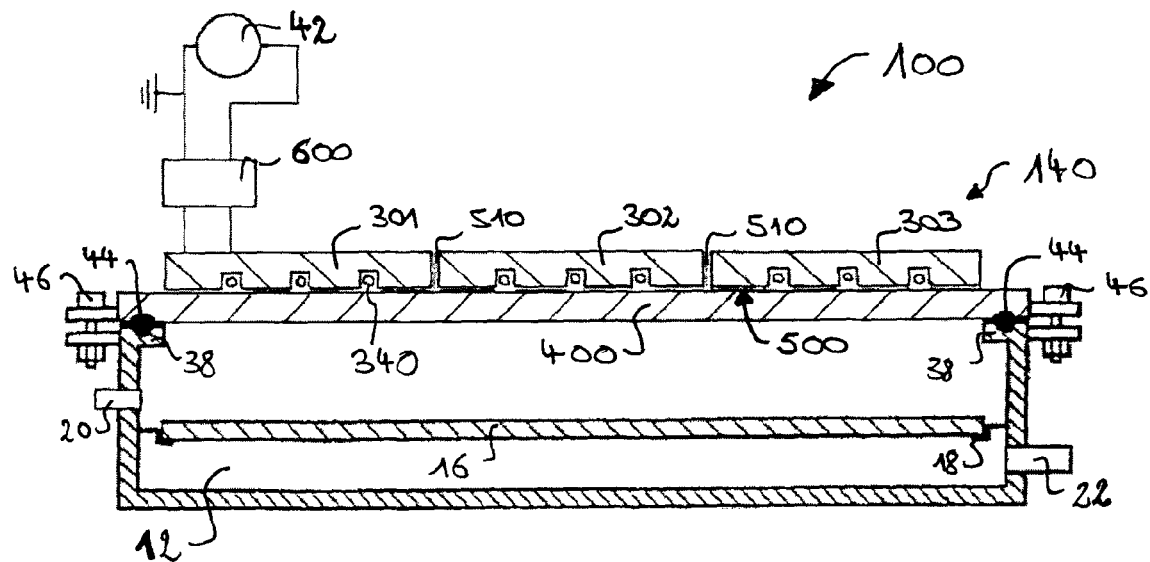
- Fig. 2 -

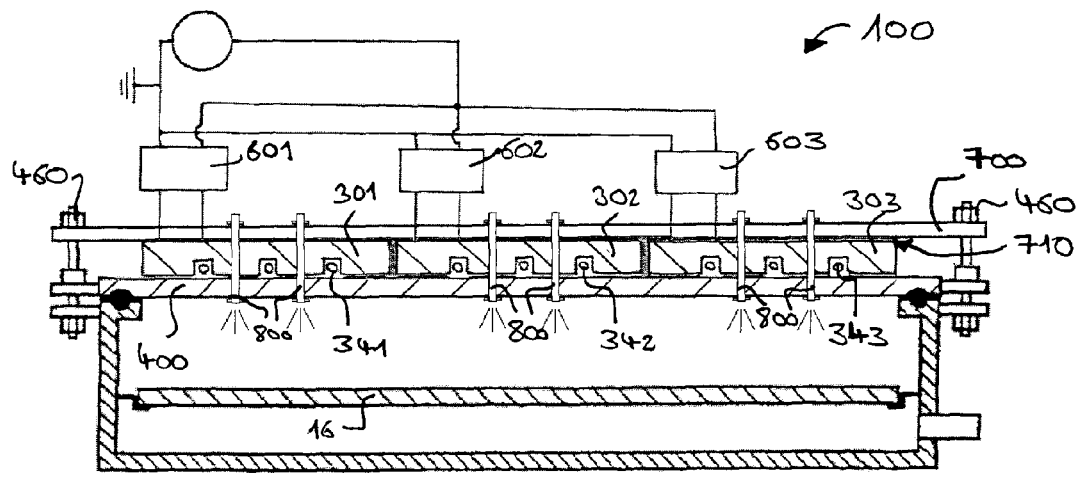
— Fig. 3 —
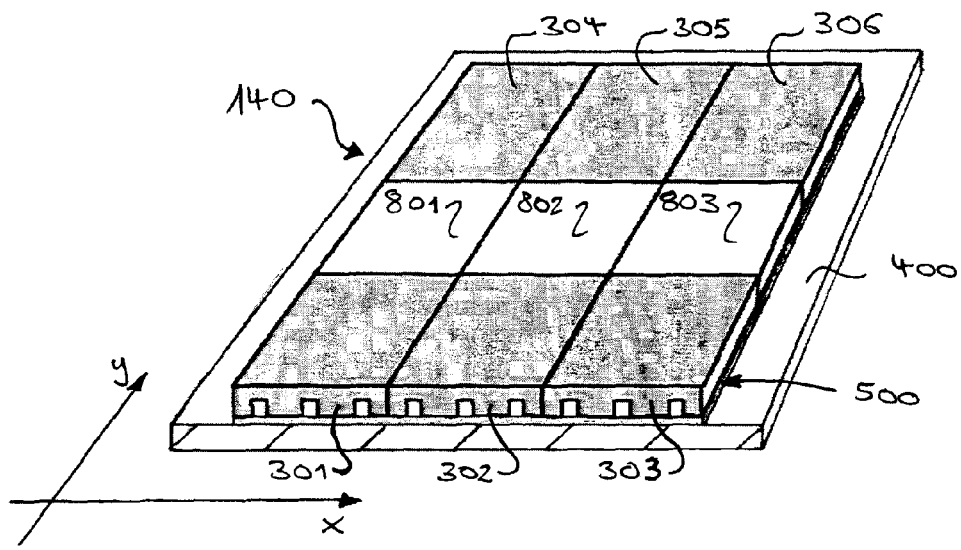
— Fig. 4 —

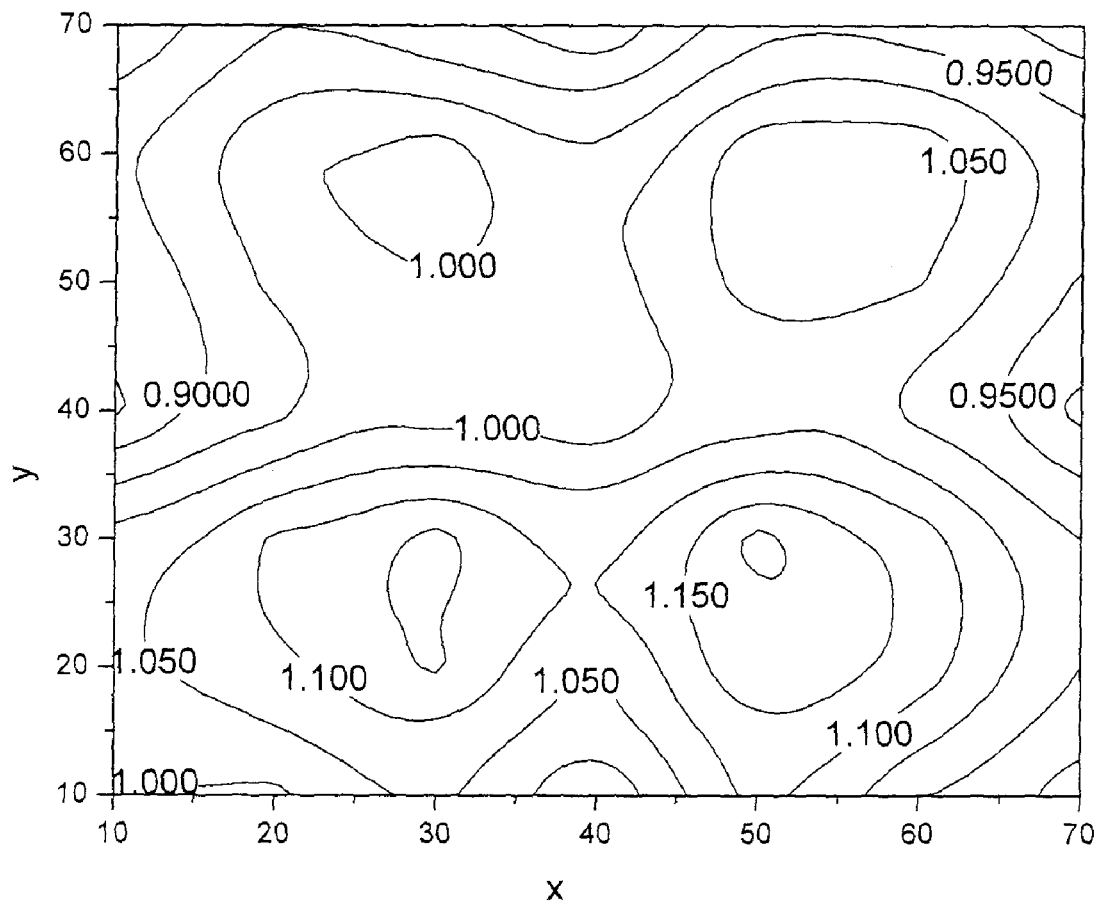
- Fig. 5 -

INDUCTIVELY COUPLED PLASMA PROCESSING APPARATUS

TECHNICAL FIELD OF THE INVENTION

The present invention relates to an inductively coupled plasma (ICP) processing apparatus and, more particularly, to a processing apparatus for processing of large-area substrates.

BRIEF DISCUSSION OF RELATED ART

Plasma processing has become an increasingly used technology over the last decades, especially because of its ability to produce fine features with high aspect ratios. As a particular example of high-density plasma sources, the inductively coupled plasma (ICP) type of source is widely used in science and industry. ICP sources (ICPs) are used e.g. in the semiconductor and the MEMS industries for surface treatments or modifications of various kinds, such as deposition, etching, ion implantation, activation, cleaning, hardening, etc.

In ICPs, the power is electro-magnetically coupled to the plasma through a field source, which comprises in general a multi-turn rf (radio frequency) coil antenna acting as primary winding of a transformer. The plasma acts as a single-turn, lossy conductor that is coupled as secondary winding to the field source placed around or adjacent to the plasma processing chamber.

Basically, two different coil configurations can be distinguished in ICPs, i.e. cylindrical and planar. In the first configuration, a coil is wound around the discharge chamber, e.g. as a helix. In the second planar coil configuration, which is more commonly used for materials processing, a flat coil, generally in spiral form, is tangentially placed adjacent to the processing chamber and separated from the discharge region by a dielectric. For additional improvement, e.g. magnetic field strength and homogeneity, it has been proposed to combine magnetic cores with the coil antenna. Such magnetic pole enhanced-ICP (MaPE-ICP) sources with planar coil configuration will be considered for the purposes of the present disclosure.

As industry transitions to processing larger substrates, e.g. large flat panel displays (FPD), large wafers ($\geq$300 mm) or photovoltaic cells, there is a need to provide large-area high-density MaPE-ICP plasma reactors that produce reactant fluxes over a large effective area. There is also a desire for increasing processing chamber productivity by processing multiple parts in parallel. The design of large-area MaPE-ICPs however raises some difficulties.

One of the problems when scaling up MaPE-ICPs is related to the increase in size of the field admission aperture, which transmits electromagnetic energy into the chamber. The sealing element, which closes the aperture is subject to considerable mechanical stresses due to the required negative internal pressure (0.5-50 mTorr). Generally speaking, the material strength, which is required to resist the pressure gradients exerted during operation, is a function of the aperture size.

Until now, two types of aperture sealing have been commonly used in MaPE-ICPs with planar coil configuration, as disclosed for example in EP 1 209 721 by the applicant. In a first embodiment, the sealing function is provided by the dielectric material. In this embodiment, a plate of dielectric material accommodating the aperture dimensions is sealingly fitted to the aperture with suitable joints for vacuum sealing. The electromagnetic field source including the magnetic core is attached to the processing chamber and located in front of the window of dielectric material. The latter approach, which is also illustrated by US 2004/060517 for example, requires the dielectric window to be of sufficient thickness to withstand the negative pressure. However, there is a significant drawback to this approach. The thickness of the dielectric window causes a reduction of efficiency. This results in increased electrical (rf) power consumption. In an alternative second embodiment, the sealing function is provided by the magnetic core, which is part of the field source. This approach is also described in EP 1 089 319 by the applicant. The thickness of dielectric material can then be drastically reduced, as its has no sealing function. However, the cost of such large size magnetic cores is considerable. If the aperture size exceeds a certain limit, suitable one-piece magnetic cores are not available at reasonable cost. Moreover, mechanical resistance of the magnetic core becomes critical with increasing size.

A further approach, which allows to reduce the thickness of the dielectric window, essentially consists in using an auxiliary mounting plate or base plate to which a plurality of comparatively smaller magnetic cores are attached. Using an additional plate installed in front of the dielectric window in order to withstand the negative pressure, as illustrated by U.S. Pat. Nos. 6,204,607 and 6,273,022 for example, allows to reduce the required thickness of the dielectric window without there being a need for large size magnetic cores. In the plasma processing chambers described in U.S. Pat. Nos. 6,204,607 and 6,273,022, such a plate is arranged in between the magnetic cores and the dielectric window. In this approach, the presence of an intermediate plate between the cores and the dielectric window results however in an undesirable reduction of coupling efficiency when compared to using a large size magnetic core combined with a thin dielectric window. U.S. Pat. No. 5,435,881 also relates to a plasma processing chamber equipped with a mounting plate which is made e.g. of aluminum. U.S. Pat. No. 5,435,881 additionally proposes, as a further alternative, to provide the mounting plate on the inside of the chamber and against the dielectric window in order to reduce the required thickness of the dielectric window. It is however generally undesirable to have any electroconductive part placed in between the dielectric window and the plasma, among others because of potential induced currents and resultant heating in such a part and because of a resulting risk of contamination of the plasma, e.g. due to so-called "sputtering".

Another problem is related to uniformity of the plasma. For high-quality and reliable products, uniform surface processing of the substrate is required, which depends on the uniformity of the plasma. The latter depends, inter alia, on the design of the field source, and in particular on the configuration of the magnetic core, the associated coil antenna and the dielectric window. With increasing workpiece area, the uniformity of the plasma becomes a critical issue.

BRIEF SUMMARY OF THE INVENTION

The invention provides an improved processing apparatus for ICP processing, which overcomes the aforementioned problems.

In order to overcome the abovementioned problems, the present invention proposes an inductively coupled plasma processing apparatus comprising a plasma chamber with a dielectric window forming a self-supporting wall element of the plasma chamber. The dielectric window has an external and an internal side with respect to the chamber. An electromagnetic field source is arranged in front of the external side of the dielectric window for generating an electromagnetic field within the plasma chamber. The field source comprises at least one magnetic core. According to an important aspect of the invention, the at least one magnetic core is mounted to, i.e. attached to, the external side of the dielectric window such that it helps the dielectric window to withstand collapsing forces caused by negative pressure inside said chamber during operation. By virtue of an intimate surface connection to the dielectric window over a certain area, the magnetic core provides the dielectric window with increased rigidity, i.e. forms a mechanical reinforcement of the latter. As the magnetic core reinforces the dielectric window, the required thickness of the latter can be significantly reduced while insuring sufficient mechanical resistance. A unique rigid structure is created which eases fixation to the plasma processing chamber. Flexibility is gained in the choice of the magnetic core type, e.g. core geometry or core material.

As will be appreciated, the plasma processing apparatus according to the invention enables increased coupling efficiency without the need for magnetic cores having the size of the field admission aperture. Furthermore, with one or more magnetic cores attached immediately to the external side of the dielectric window, this plasma processing apparatus enables the use of a comparatively thin dielectric window while concurrently eliminating the need for any additional mounting plate for the magnetic core(s) on either side of the dielectric window. As a result, additional complication of construction, operation and maintenance of the apparatus due to such additional mounting plates is avoided. The one or more magnetic cores together with the dielectric window thus form a combined sealing assembly capable of withstanding, without any further measures, the collapsing forces caused by negative pressure inside the plasma chamber during operation.

In a preferred embodiment, the electromagnetic field source comprises a plurality of separate magnetic cores attached to the external side of the dielectric window, so that they are all directly supported by the dielectric window and form mechanical reinforcements of the latter. By eliminating the one-piece requirement, the cost of the field source is drastically reduced.

Advantageously, the separate magnetic cores are attached to the external side of the dielectric window according to a predetermined pattern. The uniformity of the generated plasma can be positively influenced by positioning the separate magnetic cores relative the plasma processing chamber. Mounting the magnetic cores directly onto the dielectric window provides the required degrees of freedom.

Preferably, the separate magnetic cores are mechanically interconnected. By creating a rigid field source assembly through mutual fixation of the magnetic cores, the dielectric window is further reinforced.

In another preferred embodiment, a separator of dielectric material is arranged between at least some of the plurality of separate magnetic cores and is attached to the external side of the dielectric window, so that it is directly supported by the dielectric window and contributes to form a mechanical reinforcement of the latter. Reducing the magnetic flux concentration in front of one or more designated regions of the dielectric window, i.e. the plasma, provides further flexibility for shaping the magnetic field. Thereby plasma uniformity can be increased. Herein, the magnetic cores and the separator of dielectric material are advantageously mechanically interconnected.

The magnetic core is preferably attached to the external side of the dielectric window by means of a bonding agent.

In another preferred embodiment, the apparatus further comprises means for injecting a process gas into the chamber through the magnetic core and the dielectric window. In this case, the means for injecting a process gas advantageously form a showerhead-like gas injector together with the magnetic core and the dielectric window. Besides contributing to plasma uniformity, this arrangement also provides a unique rigid plasma source structure, which can be easily attached to or detached from the plasma processing chamber.

In case separate magnetic cores are attached to the dielectric window, a separate induction means can be associated with each magnetic core or a group of magnetic cores. Advantageously, at least two sets of the induction means are independently controllable in operation. By two or more independent inductor coils electrical control over the plasma generation area is provided.

Besides other aforementioned advantages, the described apparatus allows for electromagnetic field shaping in inductively coupled plasma processing.

BRIEF DESCRIPTION OF THE FIGURES

The present invention will be more apparent from the following description of not limiting embodiments with reference to the attached drawings, wherein FIG. 1: is a schematic cross-sectional view of a prior art plasma processing apparatus;

FIG. 2: is a schematic cross-sectional view of a plasma processing apparatus according to a first embodiment of the invention;

FIG. 3: is a schematic cross-sectional view of a plasma processing apparatus according to a second embodiment of the invention;

FIG. 4: is a perspective cross-sectional view of a field source assembly according to a third embodiment of the invention;

FIG. 5: is a 2-D plot of normalized ion current density achieved with the field source of FIG. 4

DETAILED DESCRIPTION OF THE INVENTION

FIG. 1 shows a prior art apparatus for inductively coupled plasma (ICP) processing, globally identified by reference 10. The apparatus 10 comprises a plasma processing chamber 12 and an external electromagnetic field source 14. The plasma chamber 12 provides a sealed containment in which plasma is generated or sustained and a workpiece, i.e. substrate 16, is exposed thereto. In a manner known per se, the plasma chamber 12 comprises a support 18 for the workpiece 16, and both a gas inlet port 20 and a gas outlet port 22 for regulating negative gas pressure and gas composition inside the chamber 12.

In the prior art apparatus 10, the external field source 14 comprises a one-piece magnetic core 30 mounted onto a top face of the chamber 12. On an internal side turned towards the chamber 12, the magnetic core 30 is provided with multiple recesses 32, which accommodate coil windings 34. A circumferential frame portion 36 is provided for flanging the magnetic core 30 to a rim portion 38 of the chamber 12. Within the frame portion 36, a window 40 of dielectric material is fixed to the core 30, so as to cover the recesses 32 and the coil windings 34. The dielectric window 40 is an electrical insulator between coil windings 34 and the plasma. It also prevents contamination, e.g. due to sputtering, of the plasma by material from the magnetic core 30 or the windings 34. Regarding electrical requirements, the magnetic core 30 can be made of a material having sufficient magnetic permeability and low conductivity to limit eddy currents, e.g. a laminated ferromagnetic or a magnetic powder-dielectric binder composite. The dielectric window 40 can be made of glass, quartz or polyethylene or any other suitable dielectric material.

As seen in FIG. 1, the apparatus 10 comprises an electrical radio-frequency (rf) generator 42 which supplies the current for the coil windings 34 of the field source 14. The rf currents in the coil windings 34 generate an rf magnetic flux, which is essentially confined and guided by the magnetic core 30. The rf magnetic flux penetrates the plasma region through the dielectric window 40. Within the chamber 12, the time-varying magnetic flux density induces a solenoidal rf electric field, which accelerates the free electrons and thereby generates or sustains the plasma. Other known aspects of ICP processing, such as electrical biasing and heating of the substrate 16 or cooling of the magnetic core 30, have been omitted in FIG. 1 for conciseness.

Gas-tight sealing of the chamber 12 is provided by an O-ring joint 44 arranged between the frame portion 36 and the rim portion 38 flanged together by means of several fasteners 46. In the embodiment of FIG. 1, the magnetic core 30 has a sealing function for the field admission aperture of the plasma chamber 12. Therefore, the rigidity and thickness of the magnetic core 30 must be sufficient to withstand the collapsing force of atmospheric pressure, when low pressure gas or partial vacuum conditions exist inside the chamber 12. It may be noted that the internal negative pressure is usually in the range of 0.5-50 mTorr during operation.

As can be seen in FIG. 1, the size of the field source 14 roughly determines the area over which the plasma conditions can be generated or sustained inside the chamber 12, and consequently the area of the workpiece 16 that can be processed. When scaling up the plasma chamber 12, the maximum processing area is limited by the available wall thickness and mechanical resistance of the magnetic core 30. Moreover, the choice of material composition and geometry of the magnetic core 30 is limited, due to the related mechanical requirements. FIG. 2 shows a first embodiment of a novel apparatus for inductively coupled plasma (ICP) processing, globally identified by reference 100. When compared to FIG. 1, it can be seen that the apparatus in FIG. 2 has been scaled up for processing large-area workpieces. In FIG. 2, the same reference numerals identify the same or similar parts with respect to FIG. 1.

In FIG. 2, as opposed to the known embodiment in FIG. 1, the sealing function is provided by the dielectric window 400 being a self supporting wall element of the chamber 12. The dielectric window 400 is flanged with the border of its internal side to the rim portion 38 of the chamber 12 by means of fasteners 46. Gas-tightness is insured by the O-ring joint 44 arranged between the border of the window 400 and the rim portion 38. In the apparatus 100 according to FIG. 2, the field source 140 comprises a plurality of magnetic cores 301, 302, 303. Each of the magnetic cores 301, 302, 303 is provided with some windings of a single inductor coil 340. The inductor coil 340 is arranged in "S-shaped" serpentine or any other suitable configuration through the recesses of the respective magnetic cores 301, 302, 303. The inductor coil 340 is connected to the rf generator by means of an impedance matching network 600.

As will be appreciated, each of the separate magnetic cores 301, 302, 303 is mounted directly onto, i.e. attached to the external side of the dielectric window 400. They are mounted to the dielectric window 400 by means of a thin layer 500 of a bonding agent. Additionally, the magnetic cores are mechanically interconnected by a layer 510 of bonding agent between their adjacent side faces. A suitable bonding agent is for example an isolating one-part structural epoxy adhesive, such as 3M™ Scotch-Weld™ 2214 (Non Metallic Filled). No additional support structure for the magnetic cores 301, 302, 303 is required. The magnetic cores 301, 302, 303 essentially cover the dielectric window 400 in both directions parallel and perpendicular to the plane of FIG. 2. The layer of bonding agent 500 preferably extends over the entire extent of the contacting surfaces between the dielectric window 400 and the magnetic cores 301, 302, 303. Thereby, the magnetic cores 301, 302, 303 form a mechanical reinforcement of the dielectric window 400 in both directions. In consequence, they increase the rigidity of the dielectric window 400 in order to withstand the collapsing force caused by the pressure gradients exerted onto the latter during operation.

When compared to known plasma chambers where the dielectric window has a sealing function, mounting the magnetic cores directly to the window as a reinforcement allows to reduce the required thickness of dielectric window 400 significantly. Reducing the thickness of the dielectric window 400 decreases the distance between the plasma and the coil antenna. Mutual inductance is thereby increased which results in increased coupling efficiency. When compared to known "core-sealed" plasma chambers, the mechanical requirements on the magnetic core have been alleviated or eliminated. In particular, the size of the magnetic core need not extend to the size of the field admission aperture. Thus the freedom of choice regarding the magnetic cores 301, 302, 303, e.g. material and geometry, is increased. As another effect, the total cost of the field source 140 is reduced. Obviously, the aforementioned aspects facilitate scale-up of the plasma chamber and, accordingly, contribute to plasma processing of large-area workpieces.

FIG. 3 shows a second embodiment of an ICP processing apparatus 100. For conciseness, only the differences with regard to FIG. 2 shall be detailed below. As can be seen in FIG. 3, the magnetic cores 301, 302 and 303 are mechanically interconnected on their rear face by means of an end plate 700. The end plate 700 exceeds the chamber 12 in width and is fixed to the magnetic cores by a thin layer 710 of bonding agent. In addition the end plate 700 is mounted to the housing of the chamber 12 by means of fasteners 460, for example to the same mounting structure used for mounting the dielectric window 400. Thereby, the end plate 700 provides an additional reinforcement of the sealing assembly composed of dielectric window 400 and magnetic cores 301, 302, 303. The field source 140 and in particular the dielectric window 400 gain additional mechanical resistance through this "sandwiched" construction. In case a cooling system (not shown) for the magnetic cores 301, 302, 303, is present, as common with ICP field sources, the rear plate 700 is advantageously part of this cooling system, e.g. in the form of a cooling plate. In the latter case, a bonding agent having high thermal conductivity is preferably chosen. Thereby the thickness of the dielectric window 400 can be reduced to a further extent while insuring sufficient rigidity of the aforementioned assembly. The end plate 700 is made of a dielectric material or a conducting material with an insulating face towards the magnetic cores 301, 302, 303, thus having no or little adverse effect on the return path of the magnetic flux.

As shown in FIG. 3, each of the magnetic cores 301, 302, 303 is provided with independent inductor coils 341, 342 and 343 respectively. The inductor coils 341, 342 and 343 have independent electrical connections to the rf generator 42 through respective impedance matching and tuning networks 601, 602 and 603. The independent magnetic cores 301, 302, 303 and associated inductor coils 341, 342, 343, combined with the tuning networks 601, 602, 603 allow for adjustment of the magnetic field strength along the plane of the figure. By means of the tuning networks 601, 602 and 603, the distribution of coupled energy and consequently the ion density within the plasma can be controlled so as to increase plasma uniformity in a direction parallel to the plane of FIG. 3. In particular, it has been found useful to use tuning inductances connected in series with the inductor coils 341, 342, 343 to balance the inductively coupled power over the plasma area. This is because small differences of impedance between the inductor coils 341, 342, 343 can cause some important non uniformity of the plasma. Moreover, by increasing the inductance connected to the central inductor coil 342, excessive field strength in the central region, due to field superposition from inductor coils 341 and 343 respectively, can be eliminated.

As further shown in FIG. 3, gas injection pipes 800, e.g. made of stainless steel, can be arranged within the magnetic cores 301, 302 and 303. The gas injection pipes 800 are inserted through bores which traverse the rear plate 700, the respective magnetic core 301, 302 or 303 and the dielectric window 400. The end portions of the gas injection pipes 800 are tightened to the dielectric window 400 and the rear plate 700 respectively, e.g. by means of corresponding threads and bolts. Thereby, the mechanical resistance of the dielectric window 400 is additionally increased. In a plane perpendicular to the plane of FIG. 3, additional gas injection pipes (not shown) can be arranged so as to provide an essentially uniform gas distribution above the workpiece 16. Such a showerhead-like gas above the workpiece 16 contributes to increased plasma uniformity. Alternatively, the gas injection can be effected directly through the bores without insertion of special pipes.

FIG. 4 shows an field source 140 according to a third embodiment. The field source 140 comprises a plurality of magnetic cores 301, 302, 303, 304, 305, 306 symmetrically arranged in two rows above a dielectric window 400 to which they are attached. Between the two rows, three separators 801, 802, 803 are arranged. The separators are made of dielectric material, Teflon® for example. The magnetic cores 301, 302, 303, 304, 305, 306 and the separators 801, 802, 803 are attached to the dielectric window by a relatively thin layer 500 of bonding agent. In addition, the magnetic cores 301, 302, 303, 304, 305, 306 and the separators 801, 802, 803 are preferably interconnected so as to form a mechanically rigid structure. This can be achieved by bonding together the respective adjacent faces of the latter, e.g. using the aforementioned bonding agent. Consequently, an increase in the rigidity of the field source 140 and of the dielectric window 400 is additionally achieved. As shown above, the use of independent inductor coils and associated tuning networks allows for increasing plasma uniformity in a direction parallel to the plane of FIG. 2 or FIG. 3 or perpendicular to the coil length. (x-axis in FIG. 4). The interspace between the respective rows of magnetic cores 301, 302, 303 and 304, 305, 306 in turn allows to increase plasma uniformity in the direction parallel to the coil length (y-axis in FIG. 4). Removing the magnetic poles at the center region allows to decrease the electromagnetic field locally in the direction of the y-axis. The two-dimensional configuration of the field source 140 as shown in FIG. 4 allows to reduce the excess of magnetic field strength in the central plasma region by inhibiting magnetic flux concentration.

FIG. 5 shows an exemplary plot of normalized ion current density over the (x, y)-axes of FIG. 4. FIG. 5 illustrates the uniformity of the plasma achieved by the "field shaping" measures and field source configuration as described above. It may be noted that the non-uniformity at the periphery is partly due to the wall of chamber 12 which acts as a sink for ions from the plasma. When compared to known ICPs, which generally achieve plasma non-uniformities in the order of 30-40%, plasma uniformity of approximately 15% can now be achieved, as clearly shown in FIG. 5. In conclusion, it will be appreciated that what is detailed above provides a significant contribution to ICP processing of large-area workpieces.

The invention claimed is:

1. An inductively coupled plasma processing apparatus comprising:
a plasma chamber with a field admission aperture and a dielectric window forming a self-supporting wall element of said plasma chamber that is closing and sealing in a gastight manner said field admission aperture, said dielectric window having an external and an internal side with respect to said chamber; and
an electromagnetic field source arranged in front of said external side of said dielectric window for generating an electromagnetic field within said plasma chamber, said field source comprising a plurality of separate magnetic cores; at least one separator of dielectric material wherein
said magnetic cores are arranged on the external side of said dielectric window with adjacent side faces or with said at least one separator of dielectric material arranged between two magnetic cores, such that said arrangement covers said dielectric window, and
each of said magnetic cores and separators is attached to said external side of said dielectric window by means of a thin layer of bonding agent, such that they help said dielectric window to withstand collapsing forces caused by negative pressure inside said chamber during operation.

2. The apparatus according to claim 1, wherein said separate magnetic cores are attached to the external side of said dielectric window according to a predetermined pattern with an interspace between at least two of said magnetic cores, said interspace being filled up with the separator of dielectric material.

3. The apparatus according to claim 1, wherein said separate magnetic cores are mechanically interconnected by a layer of bonding agent between their adjacent side faces.

4. The apparatus according to claim 3, wherein said magnetic cores and said separators of dielectric material are interconnected by means of respective adjacent faces that are bonded together so as to form a mechanically rigid structure.

5. The apparatus according to claim 1, further comprising a rear plate mechanically interconnecting said magnetic cores on their rear face.

6. The apparatus according to claim 5, wherein said rear plate is fixed to said rear face of said magnetic cores by means of a thin layer of bonding agent so as to form a sandwiched construction.

7. The apparatus according to claim 6, wherein said rear plate forms a cooling plate that is part of a cooling system.

8. The apparatus according to claim 1, wherein each of said separate magnetic cores is attached to the external side of said dielectric window, so that they are all directly supported by said dielectric window and form mechanical reinforcements of the latter so that no additional support structure for said magnetic cores is required.

9. The apparatus according to claim 8, wherein said magnetic cores and said separators of dielectric material are attached to the external side of said dielectric window, so that they are all directly supported by said dielectric window and form mechanical reinforcements of the latter so that no additional support structure for said magnetic cores and said separators is required.

10. The apparatus according to claim 1, further comprising means for injecting a process gas into said chamber through said magnetic cores and said dielectric window.

11. The apparatus according to claim 10, wherein said means for injecting a process gas are gas injection pipes arranged so as to provide an essentially uniform gas distribution above a workpiece.

12. The apparatus according to claim 11, wherein said means for injecting a process gas form with said magnetic cores and said dielectric window a showerhead-like gas injector.

13. An Inductively coupled plasma processing apparatus comprising:
- a plasma chamber with a field admission aperture, a rim portion and a dielectric window having an internal and an external side with respect to said chamber, said dielectric window forming a wall element of said plasma chamber and being flanged with the border of its internal side to said rim portion of said plasma chamber so as to have a gas-tight sealing function for said field admission aperture; and
- an electromagnetic field source arranged in front of said external side of said dielectric window for generating an electromagnetic field within said plasma chamber, said field source comprising a plurality of separate magnetic cores; wherein
- each magnetic core is attached immediately to the external side of said dielectric window by means of a bonding agent, such that said magnetic cores help said dielectric window to withstand collapsing forces caused by negative pressure inside said chamber during operation; and
- at least one separator of dielectric material is arranged between at least two of said plurality of separate magnetic cores and is attached to the external side of said dielectric window, so that it is directly supported by said dielectric window and contributes to form a mechanical reinforcement of the latter.

14. The apparatus according to claim 13, wherein said separate magnetic cores are mechanically interconnected by a layer of bonding agent between their adjacent side faces.

15. The apparatus according to claim 13, wherein said magnetic cores and said separators of dielectric material are interconnected by means of respective adjacent faces that are bonded together so as to form a mechanically rigid structure.

16. The apparatus according to claim 13, further comprising a rear plate fixed to said rear face of said magnetic cores by means of a thin layer of bonding agent so as to form a sandwiched construction.

17. The apparatus according to claim 16, wherein said rear plate forms a cooling plate that is part of a cooling system.

18. The apparatus according to claim 13, wherein said magnetic cores and said separators of dielectric material are attached to the external side of said dielectric window, so that they are all directly supported by said dielectric window whereby no additional support structure for said magnetic cores and said separators is required.

19. The apparatus according to claim 13, further comprising gas injection pipes for injecting a process gas into said chamber through said magnetic cores and said dielectric window, said gas injection pipes being arranged so as to provide an essentially uniform gas distribution above a workpiece.

* * * * *